United States Patent
Chen et al.

(10) Patent No.: US 8,213,178 B2
(45) Date of Patent: Jul. 3, 2012

(54) ELECTRONIC DEVICE

(75) Inventors: Ching-Chung Chen, Taipei (TW); I-Feng Hsu, Taipei (TW); Chang-Yuan Wu, Taipei (TW); Jenq-Haur Pan, Taipei (TW)

(73) Assignee: Compal Electronics, Inc., Taipei (TW)

( * ) Notice: Subject to any disclaimer, the term of this patent is extended or adjusted under 35 U.S.C. 154(b) by 109 days.

(21) Appl. No.: 12/757,057

(22) Filed: Apr. 9, 2010

(65) Prior Publication Data
US 2010/0258283 A1    Oct. 14, 2010

Related U.S. Application Data

(60) Provisional application No. 61/168,941, filed on Apr. 14, 2009.

(51) Int. Cl.
*H05K 7/20* (2006.01)

(52) U.S. Cl. ... 361/695; 361/715; 361/720; 165/104.33; 454/184; 174/252; 257/721

(58) Field of Classification Search .......... 361/688–695, 361/704, 707, 715, 717–722
See application file for complete search history.

(56) References Cited

U.S. PATENT DOCUMENTS

| | | | | |
|---|---|---|---|---|
| 5,694,294 A | * | 12/1997 | Ohashi et al. | 361/679.48 |
| 6,226,182 B1 | * | 5/2001 | Maehara | 361/695 |
| 6,459,579 B1 | * | 10/2002 | Farmer et al. | 361/695 |
| 7,218,517 B2 | * | 5/2007 | Wolford et al. | 361/695 |
| 7,248,471 B2 | * | 7/2007 | Wabiszczewicz | 361/694 |
| 7,403,385 B2 | * | 7/2008 | Boone et al. | 361/692 |
| 7,885,062 B2 | * | 2/2011 | Wagner et al. | 361/679.49 |
| 7,957,140 B2 | * | 6/2011 | Mongia | 361/695 |
| 7,974,094 B2 | * | 7/2011 | Hendrix et al. | 361/695 |
| 2005/0013116 A1 | * | 1/2005 | Pokharna et al. | 361/695 |

FOREIGN PATENT DOCUMENTS

| | | |
|---|---|---|
| CN | 101185382 | 5/2008 |
| TW | I225767 | 12/2004 |

OTHER PUBLICATIONS

"1st Office Action of China Counterpart Application", issued on Apr. 25, 2011, p. 1-p. 4.
"Office Action of Taiwan Counterpart Application", issued on Apr. 9, 2012, p1-p8, in which the listed reference was cited.

* cited by examiner

*Primary Examiner* — Courtney Smith
(74) *Attorney, Agent, or Firm* — Jianq Chyun IP Office

(57) ABSTRACT

An electronic device includes a housing, a module, a main board, and a fan. The module, the main board and the fan are all installed in the housing. The main board divides the interior of the housing into a first space and a second space, and there exists a channel opening between the main board and the module so as to communicate the first space with the second space. The fan is electrically connected to the main board, has a fan outlet and is capable of outputting airflow through the fan outlet to the outside of the housing.

18 Claims, 2 Drawing Sheets

ELECTRONIC DEVICE

CROSS-REFERENCE TO RELATED APPLICATION

This application claims the priority benefit of U.S.A. provisional application Ser. No. 61/168,941, filed on Apr. 14, 2009. The entirety of the above-mentioned patent application is hereby incorporated by reference herein and made a part of specification.

BACKGROUND OF THE INVENTION

1. Field of the Invention

The present invention relates to an electronic device. More particularly, the present invention relates to an electronic device having a plurality of connected heat dissipation spaces.

2. Description of Related Art

Generally, a host of the electronic device includes a housing and a main board disposed inside the housing, and the main board divides the interior of the housing into two spaces. Each of the two spaces further has an independent channel, and the independent channels dissipate heat for the elements generating heat at the two sides of the main board, respectively. However, when the host becomes thinner, the design of the above-described two independent channels will reduce the height of one of the channels, and therefore the convection efficiency of the channel is affected. Simultaneously, the temperature of a portion of the host adjacent to the channel with a decreased height can not be reduced smoothly, but this may influence the comfort when the user is operating the electronic device.

SUMMARY OF THE INVENTION

The invention is directed to an electronic device having favorable heat dissipation efficiency.

The present invention provides an electronic device including a housing, a module, a main board and a fan. The module, the main board and the fan are all installed in the housing. The main board divides the interior of the housing into a first space and a second space, and there exists a channel opening between the main board and the module so as to communicate the first space with the second space. The fan is electrically connected to the main board, has a fan outlet and is capable of outputting airflow through the fan outlet to the outside of the housing.

In light of the foregoing, in the above-described embodiment of the invention, the first space and the second space at the two sides of the main board respectively can connect with each other via the channel opening existing between the main board and the module. Consequently, air convection can occur between the first space and the second space to improve heat dissipation efficiency.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

In the following embodiments, the same or like numbers stand for the same or like elements for simple the numbers of these embodiments.

Figure 1:
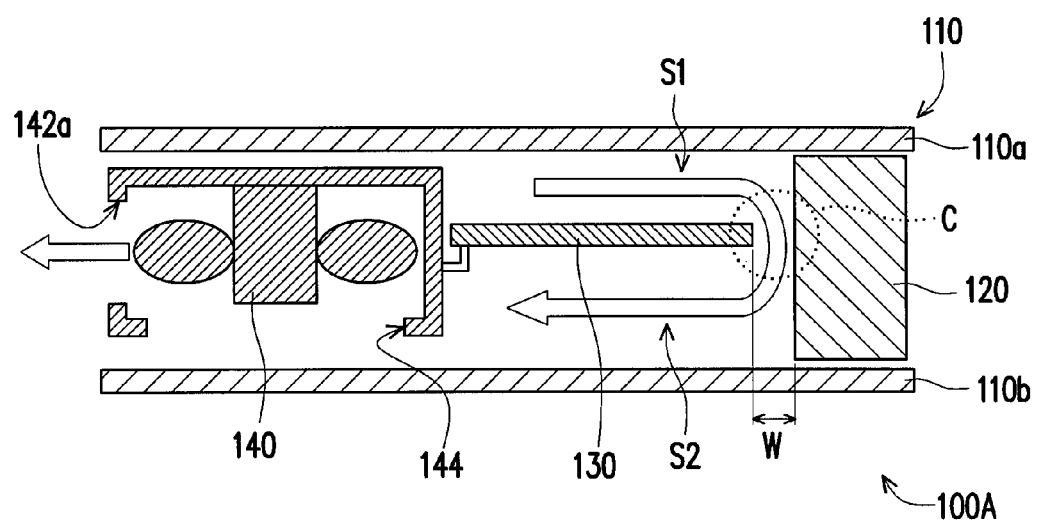
FIG. 1 is a cross-sectional view of an electronic device according to one embodiment of the present invention.

FIG. 1 is a cross-sectional view of an electronic device according to one embodiment of the present invention. Referring to FIG. 1, the electronic device 100A of the present embodiment includes a housing 110, a module 120, a main board 130 and a fan 140. The housing 110 includes an upper cover 110a and a lower cover 110b. The module 120, the main board 130 and the fan 140 are all installed in the housing 110 and located between the upper cover 110a and the lower cover 110b. The fan 140 is electrically connected to the main board 130, so that the fan 140 is controlled by the elements of the main board 130. The fan 140 has a first fan outlet 142a and is capable of outputting airflow through the first fan outlet 142a to the outside of the housing 110.

The main board 130 divides the interior of the housing 110 into a first space S1 and a second space S2. In addition, there exist a channel opening C between the main board 130 and the module 120 so as to communicate the first space S1 with the second space S2, wherein the channel opening C is located at the air channel of the first space S1 and the second space S2. However, depending on a product design, the channel opening C can be located between the main board 130 and the housing 110, but the channel opening C is not located at the end of the fan 140 adjacent to the main board 130. The channel opening C can make air convection between the first space S1 and the second space S2 so as to reduce the temperature of the upper cover 110a and the lower cover 110b of the housing 110. In the present embodiment, the width w of the channel opening C can be greater than 5 mm.

For a conventional method, when the main board 130 is installed in the housing 110, there exists a tolerance gap between the main board 130 and the module 120, but the tolerance gap is too small to be used as an air channel between the first space S1 and the second space S2. In the present embodiment, since the air channel is required to be formed to make air convection between the first space S1 and the second space S2, the width w of the channel opening C must be greater than 5 mm.

In the present embodiment, the fan 140 may further have a fan inlet 144, and the fan inlet 144 is substantially sealed by the housing 110 so as to prevent dust from the fan inlet 144 to affect the heat dissipation efficiency of the fan 140. In addition, when the electronic device 100A is a base of a notebook computer, the above module 120 can be a disk drive, for example, a hard disk device or an optical disc drive. However, depending on a product design, the module 120 can also be a connector installed on the housing 110 or be a portion of the housing 110, but it should not be regarded as limitation.

Figure 2:
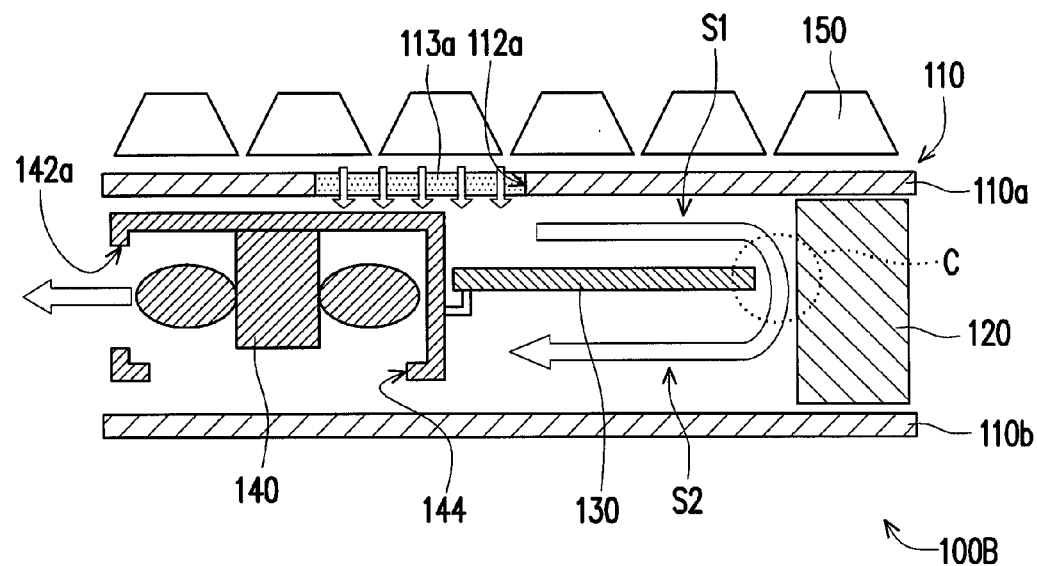
FIG. 2 is a cross-sectional view of an electronic device according to another embodiment of the present invention.

FIG. 2 is a cross-sectional view of an electronic device according to another embodiment of the present invention. Referring to FIG. 2, compared with the electronic device 100A in the FIG. 1, the housing 110 of the electronic device 100B in the embodiment of the FIG. 2 may further have a first airflow inlet 112a to allow the outside airflow to get into the first space S1. In addition, the housing 110 may further include a first permeable film 113a, and the first permeable film 113a covers the first airflow inlet 112a to block the outside liquid from passing through the first airflow inlet 112a, but allow the outside air to pass thought the first airflow inlet 112a.

In this present embodiment, when the electronic device 100B is a base of a notebook computer, the electronic device 100B may further include a keyboard 150 assembled to the housing 110, and the first airflow inlet 112a is located between the keyboard 150 and the first space S1. Therefore, the outside airflow can pass through the keyboard 150 and get into the first space S1 via the first airflow inlet 112a.

Figure 3:
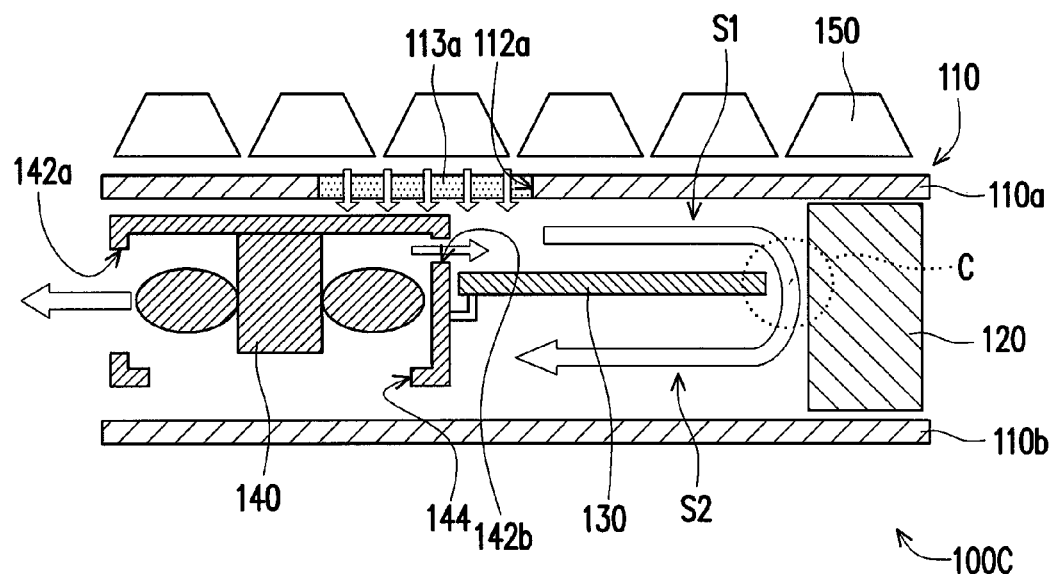
FIG. 3 is a cross-sectional view of an electronic device according to yet another embodiment of the present invention.

FIG. 3 is a cross-sectional view of an electronic device according to yet another embodiment of the present invention. Referring to FIG. 3, compared with the electronic device 100B in the FIG. 2, the fan 140 of the electronic device 100C in the embodiment of the FIG. 3 further has a second fan outlet 142b and is capable of outputting airflow through the second fan outlet 142b to the first space S1 so as to promote the hot air from the first space S1 via the channel opening C and the second space S2, and exhaust to the exterior through the fan 140. However, depending on a product design, the fan 140 can include two opposite fan inlets (not shown) to increase the intake rate of air at the fan 140a, but it should not be regarded as limitation.

Figure 4:
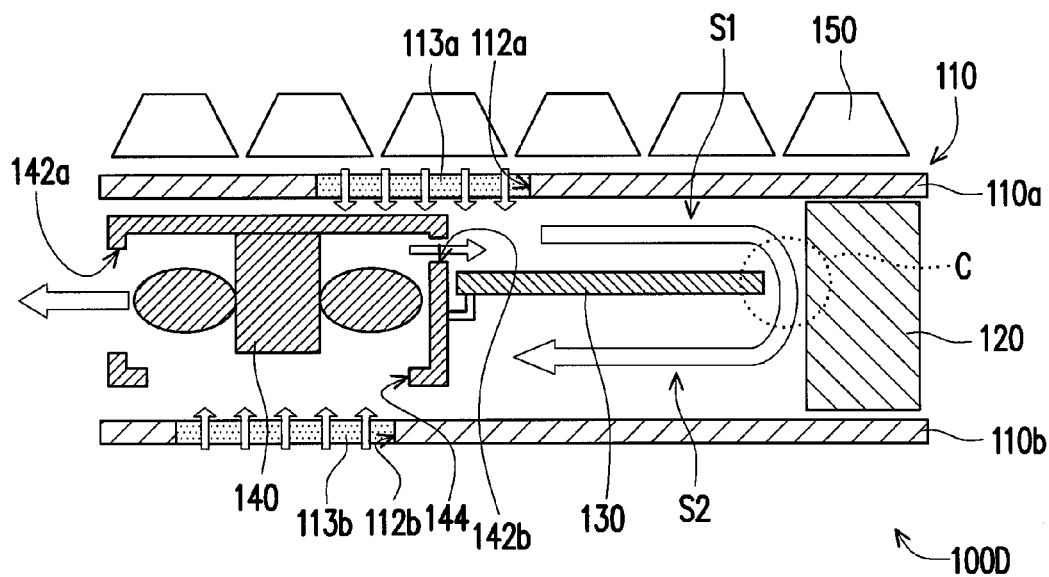
FIG. 4 is a cross-sectional view of an electronic device according to still another embodiment of the present invention.

FIG. 4 is a cross-sectional view of an electronic device according to still another embodiment of the present invention. Referring to FIG. 4, compared with the electronic device 100C in the FIG. 3, the housing 110 of the electronic device 100D in the embodiment of the FIG. 4 further has a second airflow inlet 112b to allow the outside airflow to get into the fan inlet 114 for increasing the airflow of the fan 140, and enhance the heat dissipation efficiency. In addition, the housing 110 may further include a second permeable film 113b, and the second permeable film 113b covers the second airflow inlet 112b to block the outside liquid from passing through the second airflow inlet 112b, but allow the outside air to pass thought the second airflow inlet 112b.

In summary, in the above-described embodiment of the invention, the first space and the second space at the two sides of the main board respectively can connect with each other via the channel opening existing between the main board and the module. Consequently, air convection can occur between the first space and the second space to improve heat dissipation efficiency. In addition, the housing may further have the air inlet to allow the outside airflow to get into the housing so that the heat dissipation efficiency can be improved. Furthermore, the housing may further have the permeable film to covers the airflow inlet of the housing so as to allow the outside air to get into the housing, but block the outside liquid from entering into the housing.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. An electronic device, comprising:
   a housing;
   a module installed in the housing;
   a main board installed in the housing to divide the interior of the housing into a first space and a second space, wherein there exists a channel opening between the main board and the module and located at a side edge of the main board so as to communicate the first space with the second space, and a width of the channel opening is greater than 5 mm; and
   a fan installed in the housing, located at another side edge of the main board, electrically connected to the main board and having a first fan outlet, wherein the fan is capable of outputting airflow through the first fan outlet on a sidewall of the fan to the outside of the housing.

2. The electronic device as claimed in claim 1, wherein the housing has a first airflow inlet to allow the outside airflow to get into the first space.

3. The electronic device as claimed in claim 2, wherein the housing has a first permeable film and the first permeable film covers the first airflow inlet to block the outside liquid from passing through the first airflow inlet, but allow the outside air to pass through the first airflow inlet.

4. The electronic device as claimed in claim 2, further comprising:
   a keyboard assembled to the housing, wherein the first airflow inlet is located between the keyboard and the first space.

5. The electronic device as claimed in claim 1, wherein the fan has a second fan outlet and is capable of outputting airflow through the second fan outlet to the first space.

6. The electronic device as claimed in claim 1, wherein the fan has a fan inlet and the fan inlet is substantially sealed by the housing.

7. The electronic device as claimed in claim 1, wherein the fan has a fan inlet and the housing has a second airflow inlet to allow the outside airflow to get into the fan inlet.

8. The electronic device as claimed in claim 7, wherein the housing has a second permeable film and the second permeable film covers the second airflow inlet to block the outside liquid from passing through the second airflow inlet, but allow the outside air to pass through the second airflow inlet.

9. The electronic device as claimed in claim 1, wherein the module is a disk drive or a connector.

10. An electronic device, comprising:
    a housing having a first airflow inlet;
    a module installed in the housing;
    a main board installed in the housing to divide the interior of the housing into a first space and a second space, wherein the first airflow inlet allows the outside airflow to get into the first space, and there exists a channel opening between the main board and the module and located at a side edge of the main board so as to communicate the first space with the second space; and
    a fan installed in the housing, located at another side edge of the main board, electrically connected to the main board and having a first fan outlet and a second fan outlet, wherein the fan is capable of outputting airflow through the first fan outlet on a sidewall of the fan to the outside of the housing and is capable of outputting airflow through the second fan outlet to the first space.

11. The electronic device as claimed in claim 10, wherein a width of the channel opening is greater than 5 mm.

12. The electronic device as claimed in claim 10, wherein the housing has a permeable film and the permeable film covers the first airflow inlet to block the outside liquid from passing through the first airflow inlet, but allow the outside air to pass through the first airflow inlet.

13. The electronic device as claimed in claim 10, further comprising:

a keyboard assembled to the housing, wherein the first airflow inlet is located between the keyboard and the first space.

14. The electronic device as claimed in claim 10, wherein the fan further has a fan inlet and the fan inlet is substantially sealed by the housing.

15. The electronic device as claimed in claim 10, wherein the fan has a fan inlet and the housing has a second airflow inlet to allow the outside airflow to get into the fan inlet.

16. The electronic device as claimed in claim 15, wherein the housing has a second permeable film, and the second permeable film covers the second airflow inlet to block the outside liquid from passing through the second airflow inlet, but allow the outside air to pass through the second airflow inlet.

17. The electronic device as claimed in claim 10, wherein the module is a disk drive or a connector.

18. The electronic device as claimed in claim 10, wherein the module is a portion of the housing.

* * * * *